United States Patent

[11] 3,609,574

[72] Inventor Robert G. Geissler
Cranford, N.J.

[21] Appl. No. 41,699
[22] Filed May 26, 1970
[45] Patented Sept. 28, 1971
[73] Assignee Raytheon Company
Lexington, Mass.
Continuation of application Ser. No. 717,668, Apr. 1, 1968, now abandoned.

[54] TUNNEL DIODE AMPLIFIER
7 Claims, 6 Drawing Figs.

[52] U.S. Cl. .......... 330/61 A, 333/1.1, 330/34
[51] Int. Cl. .......... H03f 15/00
[50] Field of Search .......... 330/61 A; 333/1.1, 9; 307/322, 297

[56] References Cited

UNITED STATES PATENTS

| | | | |
|---|---|---|---|
| 3,040,267 | 6/1962 | Seidel | 330/56 X |
| 3,341,783 | 9/1967 | Roulston | 330/53 X |
| 3,182,203 | 5/1965 | Miller | 307/322 |
| 3,195,051 | 7/1965 | Chang | 333/1.1 X |

FOREIGN PATENTS

| | | | |
|---|---|---|---|
| 680,490 | 2/1964 | Canada | 330/61 |

*Primary Examiner*—Nathan Kaufman
*Attorneys*—Harold A. Murphy and Joseph D. Pannone

ABSTRACT: A tunnel diode amplifier circuit including a two-stage amplifier in which one of the tunnel diode stages is located one quarter of a wavelength nearer or further away from the transmission line circulators than the other. This ¼ wavelength difference provides a complementary effect with temperature of the two stages so that the net response is considerably less effected by changing temperature as compared with that of two identical stages in cascade.

INVENTOR
ROBERT G. GEISSLER
BY Irving S. Rappaport
ATTORNEY

TUNNEL DIODE AMPLIFIER

This application is a continuation of Ser. No. 717,668 filed Apr. 1, 1968, now abandoned.

BACKGROUND OF THE INVENTION

A tunnel diode is an element which exhibits a negative resistance in its forward biased region. This negative resistance according to theoretical and experimental results extends well into the high microwave region. The linear portion of the negative resistance curve can be used to construct linear RF amplifiers. Since the negative resistance is DC actuated and is a continuous function of frequency it is very suitable for wideband applications. Tunnel diodes made from gallium antimonide or germanium have been used to achieve stable low-noise amplification at microwave frequencies.

The frequency response of tunnel diode amplifiers is determined by the voltage standing wave ratio or impedance of the transmission line circulator to which the tunnel diode is connected. The frequency response changes when the circulator impedance changes with temperature. Transmission lines circulators whose characteristics do not change with temperature are not available because the ferrite materials and magnets from which they are constructed have temperature instabilities. In prior art amplifiers, the response due to temperature changes is stabilized only by expending heater power to maintain the circulator at a constant temperature. Such prior art amplifiers often require the use of ovens to maintain the required constant temperature.

There are a number of applications for tunnel diode amplifiers in which it is absolutely essential that the amplifier response stability be maintained and yet heater power is not available. An example of such an application is the use of tunnel diode amplifiers in communication satellites. The tunnel diode amplifier of the present invention provides the necessary amplifier response stability despite changing temperature conditions and thereby overcomes the disadvantages of the prior art.

SUMMARY OF THE INVENTION

The above advantages of the present invention as well as others are achieved by providing a tunnel diode amplifier comprising: two stage amplifier including a pair of transmission line circulators and a pair of tunnel diode stages connected to the circulators in cascade with one diode state having a one-quarter of a wavelength difference in distance from the circulator than the other diode stage whereby the two diode stages compensate for temperature changes so that the net amplifier response is relatively unaffected by changing temperature.

DESCRIPTION OF THE PREFERRED EMBODIMENT

Understanding of the present invention will be aided by consideration of some of the mathematical properties relating to tunnel diode amplifiers. The frequency response of a tunnel diode amplifier is partially determined by the impedance of the transmission line circulator to which the amplifier is connected. The frequency response changes when the circulator impedance changes with temperature. The gain of the amplifier varies with the source impedance which is the impedance of the transmission line circulator. The impedance of a transmission line circulator is dependent on the length of the transmission line.

The gain of a tunnel diode amplifier in which the susceptance, B, is zero (at resonance) is represented by the equation:

$$g_v=\frac{|R_N|+R_o}{|R_N|-R_o} \qquad (1)$$

where $g_v$ is the voltage gain of the amplifier, $R_N$ is the negative resistance of the tunnel diode and $R_0$ is the impedance of the transmission line circulator.

For a tunnel diode amplifier in which the impedance of the transmission line circulator remains fixed but the susceptance varies, the total gain of the amplifier is given by the equation:

$$g_v^2=g_D=\frac{(|R_N|+R_o)^2+B^2}{(|R_N|-R_o)^2+B^2} \qquad (2)$$

where $g_p$ is the power gain of the amplifier, $R_N$ is the negative resistance of the tunnel diode, $R_0$ is the impedance of the transmission line circulator, and B is the total susceptance of the amplifier network including the contribution of the circulator.

Figure 1:
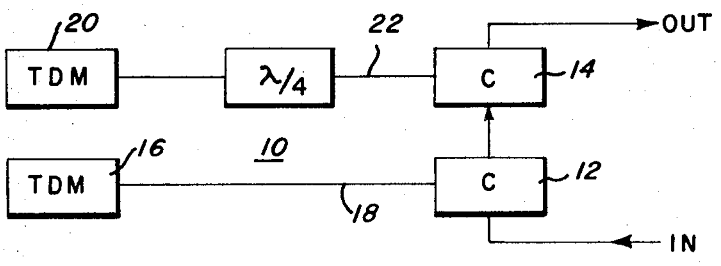
FIG. 1 is a block diagram of the tunnel diode amplifier of the present invention.

FIG. 1 shows the tunnel diode amplifier 10 of the present invention. The input signal is applied to a pair of series connected transmission line circulators 12 and 14. A tunnel diode module 16 including a tunnel diode amplifier stage is connected to the circulator 12 via a transmission line 18. A second tunnel diode module 20 including a tunnel diode amplifier stage is connected to the circulator 14 via a transmission line 22. The transmission line 22 has a length which is one-quarter of a wavelength different from the transmission line 18. The one-quarter wavelength difference of the transmission line 22 may be such that the tunnel diode module 20 is either one-quarter wavelength closer or further from the circulator 14 than the tunnel diode module 16 is located from the circulator 12. The output signal is derived from the circulator 14.

Figure 2:
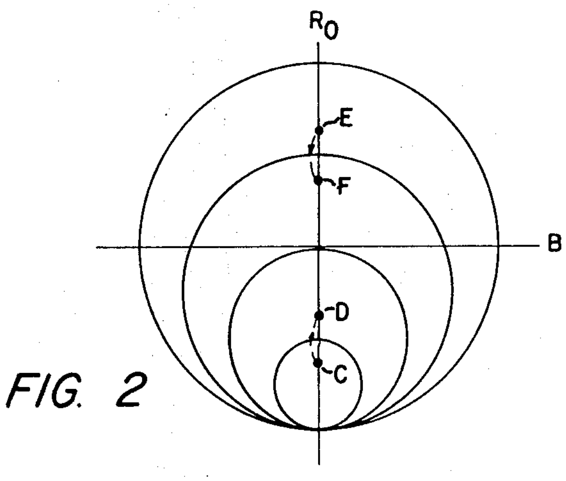
FIG. 2 is a graph of certain characteristics of the amplifier with changing temperature.

In the situation described by equation (1) above, only the impedance $R_0$ of the circulators 12 and 14 varies. The susceptance B in this situation is held constant. FIG. 2 is a 1/4 commonly referred to as a Smith Chart which plots the circulator impedance $R_0$ against the susceptance B. This chart shows that $R_0$ varies with changing temperature such that as the temperature increases, the value of $R_0$ for the tunnel diode module 16 decreases from point C to point D on the chart. With a decrease in $R_0$ from point C to point D according to equation (1), there is a corresponding decrease in the gain of tunnel diode amplifier stage including module 16 and circulator 12. By introducing a difference of one-quarter wavelength between the tunnel diode module 20 and the circulator 14, $R_0$ will be shifted 180° on the Smith Chart. With tunnel diode module 20, as the temperature increases, $R_0$ increases from point E to point F. Accordingly, the increase in $R_0$ for the tunnel diode module 20 results in a corresponding increase in the gain. Because of the complementary effect derived from the one-quarter wavelength difference in the positioning of the tunnel diode modules 16 and 20, the two stages tend to compensate one another so that changes in temperature do not effect the overall gain of the amplifier 10.

Figure 3:
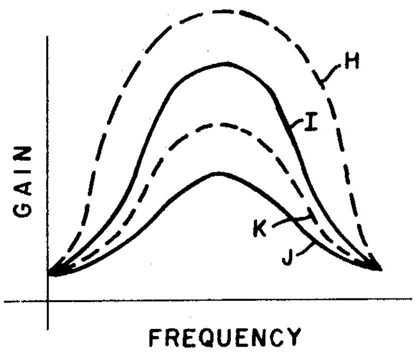
FIG. 3 is a graph of the amplifier gain versus frequency corresponding to the characteristics shown in FIG. 2.

FIG. 3 shows the resulting gain versus frequency characteristics for the temperature conditions established on the Smith Chart shown in FIG. 2. As the temperature increased, the gain versus frequency curve for the tunnel diode stage (module 16 and circulator 12) was shifted from curve H corresponding to point C in FIG. 2 to curve I corresponding to point D in FIG. 2. As the temperature increased, the gain versus frequency curve for the tunnel diode stage (module 20 and circulator 14) shifted from curve J corresponding to point E in FIG. 2 to the curve K corresponding to point F in FIG. 2. Thus, it can be seen from FIG. 3 that with respect to tunnel diode module 16, with an increase in temperature, the gain of module 16 decreased while the gain of tunnel diode module 20 increased with an increase in temperature. Therefore, the changes in gain of the two tunnel diode modules 16 and 20 with changing temperature tend to compensate one another so that the net gain of the amplifier 10 remains relatively stable.

Figure 4:
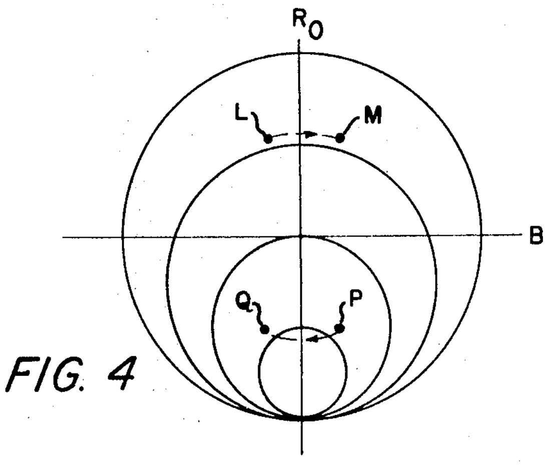
FIG. 4 is a plot of another set of characteristics of the tunnel diode amplifier of the present invention; and FIGS. *5a* and *5b* are graphs of gain versus frequency corresponding to the characteristics shown in FIG. 4.
Figure 5A:
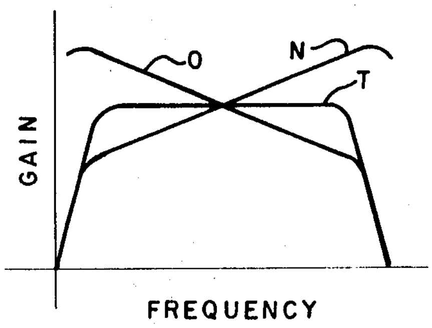
Figure 5B:
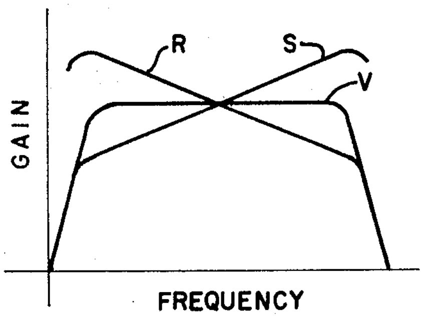

The situation where $R_o$ remains constant and B changes is depicted in FIG. 4. As temperature increases from point L to point M on the Smith Chart shown in FIG. 4, B for tunnel diode module 16 increases with a resultant decrease in the center frequency of the amplifier 10. This decrease in the center frequency causes a change in the slope over a frequency band of interest from curve N to curve O in FIG. *5a*. In the tunnel diode module 20 having a one-quarter wavelength difference from tunnel diode module 16, as the temperature increases from point P to point Q. in FIG. 4, B decreases. The decrease in B results in an increase in the center frequency of the tunnel diode module 20 thereby causing changes in the gain over the frequency band of interest from curve R to curve S as shown in FIG. *5b*. Therefore, the modules 16 and 20 tend to compensate one another since the changing slopes of the gain curves of the two stages change in opposite directions. As a result, the curves N and R in FIG. 5 compensate one another and the two curves O and S compensate one another so that the resultant net gain is shown by the flattened curves T and V in FIGS. *5a* and *5b*.

Therefore, by employing the one-quarter wavelength difference between the two tunnel diode modules 16 and 20 in the tunnel diode amplifier of the present invention, the changes in gain and frequency between the two stages of the amplifier are compensated with changing temperature so that the net response of the amplifier remains relatively stable. The present invention is particularly useful in applications where heater power is unavailable to maintain constant temperature. As a result, the present invention is especially useful in tunnel diode amplifiers for use in communication satellites, high-quality radio relay systems, radio astronomy and any other amplitude sensitive system where it may not be possible to maintain a constant temperature environment.

It should be understood, of course, that the foregoing disclosure relates to only a preferred embodiment of the invention and that numerous modifications or alterations may be made therein without departing from the spirit and the scope of the invention as set forth in the appended claims.

I claim:

1. In combination:
- means for receiving an input signal;
- first and second transmission line circulators;
- means coupling input signals to the input of said first transmission line circulator;
- means coupling the output of said first transmission line circulator to the input of said second transmission line circulator;
- first and second negative resistance devices coupled respectively to said first and second circulators;
- a length of transmission line connecting each of said first and second negative resistance devices to said first and second transmission line circulator respectively, said transmission lines having different effective lengths; and
- means for driving an output signal from said second transmission line circulator.

2. The combination in accordance with claim 1 wherein at least one of said negative resistance devices comprises a negative resistance semiconductor amplifier.

3. The combination in accordance with claim 2 wherein said negative resistance semiconductor device has a barrier junction having a negative slope voltage current characteristic.

4. A negative resistance amplifier for minimizing variations in gain with changing temperature, said amplifier comprising:
- means for receiving an input signal;
- first and second transmission line circulators connected in series such that said input signal is coupled to the input port of said first transmission line circulator;
- a first negative resistance amplifying stage connected to said first circulator by a length of transmission line;
- a second negative resistance amplifying stage connected to said second circulator by a length of transmission line which differs from the length of the other line by approximately a quarter of a wavelength such that the changes in gain and frequency between the two amplifying stages are compensated by changing temperature so that the net response of the amplifier remains relatively stable; and
- means for deriving an output signal from the output port of said second transmission line circulator.

5. a two-stage tunnel diode amplifier for minimizing variations in gain and frequency response with changing temperature, said amplifier comprising:
- a three port transmission line circulator for receiving an input signal at the first port;
- a module including a tunnel diode amplifying stage associated with said circulator;
- a length of transmission line connecting said module with the second port of said circulator;
- another three port transmission line circulator connected in series with said other circulator;
- another module including a tunnel diode amplifying stage associated with said another circulator; and
- another length of transmission line connecting said another module with said another circulator at the second port of said another circulator but differing in length from said other line by approximately one-quarter of a wavelength such that the changes in gain and frequency between the two stages are compensated with changing temperature so that the net response of the amplifier remains relatively stable; and
- means for deriving an output signal from the third port of said another circulator.

6. An amplifier in accordance with claim 5 wherein said amplifying stages comprise a negative resistance semiconductor device.

7. An amplifier in accordance with claim 6 wherein said semiconductor device has a junction having voltage current characteristics having a negative region.

UNITED STATES PATENT OFFICE
CERTIFICATE OF CORRECTION

Patent No. 3,609,574 Dated September 28, 1971

Inventor(s) Robert G. Geissler

It is certified that error appears in the above-identified patent and that said Letters Patent are hereby corrected as shown below:

In the Specification

Column 1, line 46 change "state" to --stage--.

Column 2, line 41 change "1/4" to --graph--.

In the Claims

Claim 1, column 4, line 1 after "effective" insert --electrical--.

Claim 5, column 4, line 27 change "a" to --A--.

Signed and sealed this 9th day of May 1972.

(SEAL)
Attest:

EDWARD M.FLETCHER, JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334